Figure 1:
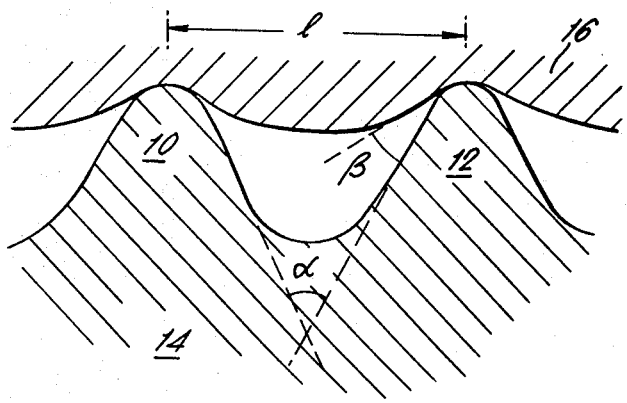

United States Patent [19]

Davey et al.

[11] 4,268,483

[45] May 19, 1981

[54] IMPROVEMENTS IN AND RELATING TO THE GROWTH OF CRYSTALLINE MATERIAL

[75] Inventors: Keith S. A. Davey, Cambridge; Rowland M. Ware, Cottenham, both of England

[73] Assignee: Metals Research Limited, Hartfordshire, England

[21] Appl. No.: 777,352

[22] Filed: Mar. 14, 1977

[30] Foreign Application Priority Data

Mar. 17, 1976 [GB] United Kingdom ............... 10643/76

[51] Int. Cl.³ .............................................. C30B 15/34
[52] U.S. Cl. ............................ 422/246; 156/DIG. 83
[58] Field of Search ......... 156/608, DIG. 83, 617 SP; 425/461, 113; 23/273 SP; 164/60; 422/246

[56] References Cited

U.S. PATENT DOCUMENTS

| 3,078,151 | 2/1963 | Kappelmeyer | 156/608 |
| 3,245,674 | 4/1966 | Baer | 427/237 |
| 3,265,469 | 8/1966 | Hall | 156/608 |
| 3,796,548 | 3/1974 | Boss | 156/DIG. 83 |

FOREIGN PATENT DOCUMENTS

| 656987 | 11/1964 | Belgium | 156/DIG. 83 |
| 658110 | 1/1965 | Belgium | 156/DIG. 83 |
| 2554354 | 10/1976 | Fed. Rep. of Germany | 156/608 |

OTHER PUBLICATIONS

Tsivinskii et al., Soviet Physics-Solid State vol. 7, #1, Jul. 1965, pp. 148-152.

Sachkov et al., Izvestiya Akademmi Nauk USSR vol. 37 #11, pp. 2288-2291, 1973.

Egorov, Izvestiya Akademmi Nauk USSR vol. 37, #11, pp. 2277-2279, 1973.

Swets, Electrochemical Technology, Jul.-Aug. 1967, vol. 5, #7-8, pp. 385-389.

Primary Examiner—Hiram Bernstein
Attorney, Agent, or Firm—Oblon, Fisher, Spivak, McClelland & Maier

[57] ABSTRACT

Apparatus is described for controlling the crystallization of semi-conductor materials involving the use of a shape forming member or die having a passage within which the crystallization interface is located and kept during the growth process. Techniques are disclosed for reducing the angle of contact measured outside the liquid between the melt liquid within the passage and the material forming the wall of the passage. The basic technique involves the formation of a rough surface typically by machining ridges in the surface of the passage. Formulae are derived for determining the maximum elemental spacing between ridges and the minimum depth of the grooves therebetween so that a liquid melt surface is supported wholly by surface tension forces between the ridges.

Examples of spacing and depth parameters for various melt/die material combinations are given.

Differential elemental spacing from one region of a die surface to another is employed so as to reduce the surface working requirements to the minimum.

Composite dies in which a fluid under pressure additionally supports the melt liquid surface are also described.

29 Claims, 11 Drawing Figures

IMPROVEMENTS IN AND RELATING TO THE GROWTH OF CRYSTALLINE MATERIAL

FIELD OF THE INVENTION

This invention relates to the manufacture of crystals and is particularly concerned with growing crystals in the form of single crystal strip or ribbon from which single crystal wafers can be cut for use in semi-conductor devices.

PRIOR ART

One method of making crystal wafers for use in semiconductor devices has been firstly to grow crystals of relatively thick cross section, for example cylindrical cross section by the well-known Czochralski process, in which a melt of crystallisable material is formed in a crucible, a seed crystal is dipped into the melt and the seed crystal is pulled from the melt at a slow rate as the required crystal grows. After the crystal has been grown, it is then sliced into required wafers. This process is disadvantageous in that the slicing operation involves considerable waste of crystal, which itself is expensive and the expenditure of time in slicing the crystal into wafers. An example of the Czochralski method can be seen in U.S. Pat. No. 3,647,389. Further examples of this method, in which attempts to obtain more accurate control of the cross sectional area of the growing crystal have been made by growing the crystal through an aperture in a shape forming member as can be seen in U.S. Pat. Nos. 3,265,469; 3,291,574; 3,291,650; and 3,078,151.

Proposals have also been made in the prior art for the growing of crystals actually in ribbon or strip form. One such method is proposed in U.S. Pat. No. 3,124,489, Vogel, in which the melt is forced under pressure through a narrow slot in a die and the freezing interface between the melt and the grown crystal is established precisely at the exit to the slot. U.S. Pat. No. 3,124,489 explains that if the point of freezing should move beyond the edge of the slot there is a loss of control over the dimensions of the growing crystal, and also reports experimental results which showed that if the point of freezing moved downwardly within the slot, the growing crystal jammed within the slot, thus preventing the growing process from proceeding. Accordingly, very precise temperature control was found to be necessary so as to maintain the point of freezing just beyond the edge of the slot in order to allow the process described in U.S. Pat. 3,124,489 to work. In practice, such very precise control is virtually impossible to achieve except under laboratory conditions.

Other methods for growing crystals actually in ribbon or strip form are described in an article entitled "Growth of Nondendritic Single-Crystal Ribbons of Germanium" by Don E. Swets which appeared in "Electrochemical Technology" July–August 1967 Pages 385 to 389 and in an article entitled "The Production of Germanium Single Crystals of Predetermined Shape" by Tsiviniskii and Stepanov in "Soviet Physics—Solid State" Vol. 7 No. 1 July 1963 Pages 148 to 152. In both methods a die having a slit is forced down into the melt either by its own weight or by applied pressure so as to force the melt into the slot so as to form a mensicus just above the upper extremity of the slot. The crystallization is performed from this meniscus. The ends of the slot are enlarged with the result that the grown crystal is of dumb-bell shaped cross section and although a ribbon-like crystal is grown the edges have to be cut off in view of the dumb-bell shape to provide the required flat wafers. Swets in particular acknowledges that precise control of the growing conditions, particularly to temperature, is necessary to avoid variations in the dimensions of the growing ribbon, and as previously stated, Applicants have found that such precise control is virtually impossible to obtain other than under laboratory conditions, for relatively short periods of time and therefore short lengths of ribbon.

Comments on the difficulties associated with attempts to grow crystals according to the growth processes proposed by Tsivinskii and Stepanov are contained in an article entitled "Control of Capillary Shaping of Single Crystals during the Growth Process" by Sachkov, Tatarchenko and Levinzon and in an articles entitled "Features of the Growth of Thin Germanium Strip by Stepanov's Method with Elevated Melt Pressure in the Shaper" by Egorov, Zatulovskii and Chaikin which appeared at pages 2277–2279 of Vol. 37 No. 11, 1973 of "Izvestiya Akademmi Nauk SSSR, Seriya Fizicheskaya". In particular Egorov et al acknowledged that they encountered definite difficulties in attempting to keep the crystallisation front at the necessary height, so that variation in the cross section of the growing crystal resulted. Dagger shaped strips and strips which became narrower as the process was carried on were produced and in another example it was found that the melt column spread out as the crystallisation front rose above the shaper.

An alternative approach to the problem of growing ribbon or strip like crystals is described in an article entitled "Edge Defined Film Fed Crystal Growth" by Chalmers, LaBelle and Mlavski which appeared in "Journal of Crystal Growth" Vols. 13/14 1972 Page 84. In this alternative method (commonly referred to as the EFG method) the previous attempts to confine the crystallizing interface by the walls of the slot have been abandoned and the characteristics of a wetting surface have been used to generate a platform of the melt which is fed by capillary action. The surface of the platform is wet by the melt so that the periphery of the platform defines the shape and area of cross section of the meniscus at the upper end of the capillary. The two main problems associated with this method are:

(1) the ever present problem of contamination between the melt and the die material forming the surfaces of the capilliary and platform since for the method to work, these surfaces must be significantly wet by the melt, and (2) the difficulty of maintaining sufficiently accurate temperature control so as to produce a flat isotherm over the entire width of the platform. This flat isotherm is necessary to produce dimensional stability in the growing ribbon.

The EFG process described in the article entitled "Edge Defined Film Fed Crystal Growth" has been developed into a commercial process for producing Silicon ribbon crystals having dimensions of the order of 25 millimeters width and half a millimeter thickness and a report has been released by the U.S. Department of Commerce entitled "Continuous Silicon Solar Cells" by B. Chalmers et al under No. NSF/RA/N75/122 (distributed by National Technical Information Service for National Science Foundation) which described the many stages of development which have led to the present level of success of the EFG process. However the overriding principle of operation of that process remains unchanged and is based on the use of a shape forming member made of a material which is wetted by the melt and a proportion of the development work discussed in the report by Chalmers et al is concerned with improving the wetting characteristics of surfaces. In particular the work concentrated on improving the wetting characteristic of a silica shape former when the melt material is Silicon.

Whilst the EFG process can, and has been made to work on a commercial basis the difficulties of successful operation of this process and the need for a wetting relationship between shape former and melt has caused the Applicants to concentrate on the development of the alternative process of Deep Slot Pressure Fed Growth (referred to as the DSPG process) in which the melt does *not* wet the material of the shape former and in which the crystallization interface and therefore the area and shape of cross section of the growing crystal is surrounded by a physical surface (e.g. the walls of a slot) because of the inherent advantages which the Applicants have found when growing in such an environment. In particular the Applicants have noted that under appropriate conditions it is possible for the temperature within a slot to rise or fall quite considerably thereby causing the freezing isotherm at which crystallization occurs to move up or down within the slot. However, because of the physical constraints placed on the growing crystal by the walls of the slot in the DSPG process the area of cross section of the growing crystal remains substantially constant or varies only in accordance with any variation in the area of cross section or dimensions of the slot with depth. To this end it has been proposed in British Patent Application No. 52379/74 (hereinafter referred to as "the aforementioned application") that in a shape forming member or die which contains a narrow slot for defining the dimensions and area of cross section of the growing crystal, at least the walls of the slot are formed from a material which is not wetted by the melt so that the latter has to be introduced into the slot under pressure and the thermal conditions surrounding and within the slot are arranged to locate the freezing isotherm within the slot (preferably half way between the top and bottom of the slot) and the pressure in the melt is maintained at a level sufficient to produce a convex meniscus (i.e. convex liquid surface) along the entire periphery of the crystallizing interface (i.e. an all-convex meniscus).

It is therefore a basic requirement of the proposals contained in the aforementioned application, and of the DSPG process, that a non-wetting or substantially non-wetting relationship must exist between the melt and the material forming at least the walls of the slot (i.e. the internal surface of the slot). Only when such a relationship exists is it possible to obtain the correct relationship between the angle of contact $\theta$ between the melt and the wall material (measured outside the melt) and the run-off angle $\theta$ as defined in the aforementioned application between the crystallized material and the melt. A completely non-wetting relationship exists when the angle of contact (as defined aboe—i.e. measured outside the melt) is zero.

For a given melt and die material combination in which $\theta$ (as defined above) is small or zero, the relationship between $\theta$ and $\phi$ will usually be such that an all convex meniscus can be obtained without taking any steps to reduce $\theta$ further. The only requirements then will be to use an appropriately dimensioned slot and maintain the correct pressure in the melt to enable the method of growth described and claimed in the aforementioned application to be performed.

As described in the aforementioned application, remedial steps can be taken to counteract too large a value of $\theta$ by employing a diverging walled slot and/or using a barrier fluid.

In the first case the actual angle of contact $\theta$ remains unchanged but the apparent angle of contact (as seen from the standpoint of the run off angle $\phi$) is reduced.

In the second case the barrier fluid is selected for its contact angle relationship with the melt and the slot material, so as to produce an effective zero angle of contact between melt and slot wall.

Whilst it is possible to simulate an apparently small or zero angle of contact between the melt and the wall surface when viewed in relation to the run off angle between the melt and the crystallized material by using a barrier fluid or a diverging walled slot, it is not always possible to find a suitable barrier fluid. If a large wall divergence is required to compensate for a particularly large actual angle of contact between the melt and the slot wall material, a reduction in stability of ribbon dimensions results.

It is an object of the present invention to provide an improved die for growing crystalline material, particularly a die having a slot for growing crystalline material in the form of a ribbon or strip according to the DSPG process, in which the angle of contact (when measured outside the melt) between the melt and the die material is reduced.

It is another object of the present invention to provide a method of reducing the angle of contact between a given melt and a given material forming a die, in which crystallization of the melt is to be performed according to the DSPG process.

It is a further object of the present invention to provide a method of DSPG crystal growth which will allow the formation of crystalline ribbon or strip from a given melt of greater widths than has hitherto been possible when growing from within a deep slot in a die or shape former, formed from a material which does not normally have an appropriate angle of contact with melt liquid.

THE INVENTION

The invention provides a shape forming member or die having a passage for defining the meniscus of a melt which is to be crystallized and through which the crystallized material is drawn, in which at least the surface of the passage is formed from a material having an angle of contact $\theta$ with the liquid melt of less than 90°, ($\theta$ measured outside the liquid) characterised in that: at least the surface of the passage is rough so as to decrease the angle of contact $\theta$ between the melt and the passage wall material.

As employed herein the term "rough" means a surface which comprises either:
(1) one or more sets of closely spaced grooves or ridges in which each set may be parallel to perpendicular or at any intermediate angle to the direction in which the crystallized material is drawn, or
(2) one or more helical grooves or ridges similar to a screw thread-form, with the axis of the helix parallel or perpendicular or at any intermediate angle to the direction in which the crystallized material is drawn, or
(3) closely spaced protrusions, or (4) closely spaced surface craters or holes, or
(5) a fine mesh foil or criss-cross littice.

The surface can thus be considered to support the melt liquid surface on a plurality of points or lines or elemental areas and the effective reduction in $\theta$ can be sufficient to allow a parallel sided passage to be used, if required.

The invention may be applied to a shape former or die having any shape of passage section such as a circular passage section for growing circular section crystals but is of particular application to a shape former or die containing a narrow slot in which the crystallization process is carried out so as to permit the growth of crystals in the form of single crystal strip or ribbon.

Although benefits are obtained by providing a rough surface on the walls of the passage within which the meniscus and crystallizing front are located, other benefits are obtained by providing that some or all of the external surface of the shape former or die is rough, since by doing so cross-contamination between the die material and the melt liquid is reduced to a minimum. A shape former or die embodying the invention may be formed from a material which in accordance with the definition above, is completely not-wetted by the melt so as to reduce the area of contact between the melt liquid and material surface to the minimum. However the real advantage of the invention is realized when a preferred die material has an angle of contact with the particular melt, which is of such a value that an excessive divergence of the passage would be needed to allow the material to be used as a die material. When the invention is applied to a die formed from such a die material the effective reduction in the angle of contact $\theta$ is such that either no divergence or only a very small divergence of the passage is required.

By divergence is meant the gradual enlargement of the area of cross-section of the passage along the length thereof towards the end from which the crystallized material is draw.

It should be noted tht although by incorporating the invention it is possible to dispense with divergence of the passage (previously needed to compensate for an inappropriate $\theta$-$\phi$ relationship), it may nevertheless be desirable to include a small divergence simply to assist in introducing the seed crystal into the passage.

When the melt is germanium, then graphite, silicon carbide, Pyrolitic boron nitride, silicon nitride or quartz may for example be used as the die material.

When the melt liquid is Silicon, then Beryllia, Pyrolytic Boron Nitride or Thoria may for example be used as the die material.

As employed herein, the term "die material" is taken to mean "the material forming at least the surface of the passage in the die or shape forming member".

Where the preferred material is expensive or difficult to obtain except in a thin film state, the die is preferably formed from a suitable alternative material the surface of which, at least in the passage, is coated with the preferred material. Thus for example a die formed basically from graphite may be coated with Pyrolytic Boron Nitride (for example by vapour deposition) the graphite or the coating being machined to form ridges or points or otherwise worked, to give the required rough surface.

The invention also provides a method of forming a die having a passage within which crystallization of a particular melt in accordance with the aforementioned application can be performed, which comprises the steps of machining the surface of the material forming at least the surface of the wall or walls of the passage in which the crystallization is to occur, so as to form in the surface thereof a plurality of closely spaced parallel ridges. To facilitate machining, such a die is conveniently formed from two or more sections, which are clamped or bonded together.

The invention also provides a method of forming a die or shape former having a passage for containing the meniscus of a melt liquid from which crystallized material can be drawn, comprising the steps of forming at least two members which, when abutted together, comprise the die or shape former; each member containing part of the wall surface of the passage and, prior to abutting the two members together, surface working at least the regions thereof which define the wall surface of the passage.

Where the die is formed from two or more parts, these are preferably held together by releasable clamping means to allow the die parts to be removed after a crystallization process for cleaning and/or reworking as by machining or etching or sandblasting.

The surface working to form the rough surface may be of a base material, and a coating of the preferred die material may be applied thereover after the surface working such as by vapour deposition. Alternatively this coating of the said preferred die material may be applied first and the surface working carried out after the coating has been applied.

Where the surface working is by sandblasting, a grit is employed which will produce craters in the surface of sufficient size and spacing so as to leave elemental areas in the surface having the required size spacing and shape to produce the appropriate angle of contact with the melt liquid to be used therewith. Where the surface working involves machining, a cutting or milling tool may be employed.

It is to be understood that although examples of machining and sandblasting have been given the invention is not limited to any particular method of surface working and other methods such as spark erosion, chemical etching, electron beam etching, and diamond scribing may be employed. Alternatively the rough surface may be formed by a deposition process (such as by vapour deposition, already mentioned, or by crystallization or epitaxial growth and it is envisaged that under controlled conditions the surface finish obtained by such process may be sufficiently rough as to produce the desired reduction in angle of contact with the melt liquid with which the die is to be used.

As employed herein in relation to the spacing of the ridges or protrusions, or elemental areas between surface craters or holes, the term "closely spaced" denotes a spacing therebetween which can be bridged by the liquid melt supported by surface tension forces acting between the ridges or protrusions or elemental areas.

If the spacing is too great, the liquid melt cannot be so supported and the liquid melt will tend to flow into the grooves or craters or holes and the relationship between the melt liquid and the die surface will become less non-wetting. The maximum permissible spacing consistent with the above definition for a given melt and die surface combination, can be calculated from the physical properties of the melt and die surface and the hydrostatic pressure within the melt liquid which exists at the die surface (which can be deduced using the Laplace theory for the pressure difference across a curved liquid surface).

Where the spacing between the ridges or protrusions or elemental areas is such that the surface tension forces hold the liquid surface clear of the troughs or craters or holes therebetween the surface can be said to be "wholly supported" thereon by means of the surface tension forces acting therebetween. Where the spacing and/or the pressure within the liquid and/or the surface tension forces in the surface of the liquid is/are such that the liquid penetrates to some extent into the troughs or craters or holes the surface of the liquid will make contact with more of the surface in which event the liquid surface is said to be only "partly supported" on the ridges or protrusions or elemental areas. Maximum benefits of the invention are obtained when the liquid surface is "wholly supported" although sufficient benefit may be obtained for some applications, when the liquid is only "partly supported".

In some situations it may be desirable to assist in the supporting of the liquid surface by means of a fluid barrier of an inert gas or a liquid. This may conveniently be introduced under the appropriate pressure into the troughs or craters or holes and to this end apertures to allow for such introduction may be provided in the body of the die.

As will be seen later from a detailed consideration of particular die surface configurations, the maximum spacing that can be permitted between for example neighboring ridges or points, so that the surface of a liquid melt is supported therebetween by surface tension forces (to be referred to as the elemental spacing for the surface) will depend on the hydrostatic pressure within the liquid melt at the surface in contact with the ridges or points. This pressure will in known manner vary with depth and this variation gives rise to certain factors:

(1) If it is only required to reduce the liquid-solid angle of contact $\theta$ to ° at one place (i.e. at the level at which the meniscus surrounding the freezing interface becomes tangential to the passage wall) then it is only necessary to consider the pressure at that place.

(2) If it is desired that the freezing interface can move up or down the passage, to accommodate variations in thermal conditions within the passage, then the highest melt pressure which will be exerted at the melt surface to be supported on the ridges or points in the passage must be taken into consideration in arriving at the value for the spacing between the ridges or points (i.e. elemental spacing).

(3) If some or all of the external surface of the die or shape forming member is formed with ridges or points (in addition to the passage wall surface) so as to reduce cross contamination between the die (or shape forming member) and the melt, then the highest melt pressure which will be exerted at the melt surface which is supported on the ridges or points (both in the passage and on the externally roughened surface) must be taken into consideration in arriving at the value for the spacing between the ridges or points (i.e. elemental spacing).

Leading from this it has been found that a preferred construction of die (or shape forming member) involves the provision of a rough surface having a first elemental spacing between neighbouring ridges or points over that region of the passage in which the crystal growth interface is normally located (as determined by the two extremes of thermal conditions which can occur within the passage) and having a second elemental spacing between neighbouring ridges or points over the remainder of the wall surface of the passage and (where provided) over the external surface of the die (or shape forming member) which is roughened to reduce cross contamination.

Where the passage is formed in a die which is designed to float on a melt or into which the melt is forced under pressure from below, the hydrostatic pressure will increase with depth, and it is found (as will be shown from theoretical considerations later) that the second elemental spacing has to be smaller than the first elemental spacing. (If the flow of melt through the passage is in the downward direction (i.e. the die is fed from above) then opposite spacing criteria will apply).

This facility can simplify the machining of die materials to form the rough surface(s) required by the invention. From one standpoint, the area over which costly machining of the smaller spaced grooves can be reduced to a minimum and from another standpoint, where the pressure is less in the growth region than elsewhere (e.g. in a floating or bottom fed die), the increased spacing permitted in the growth region will allow greater attention to be paid to the cross section shape of the ridges or points and the formation of knife-edges or pin-points as appropriate.

The invention also provides a method of crystal growth comprising the steps of introducing a liquid melt into one end of a passage formed in a die or shape former embodying the invention, to form a meniscus therein, introducing a seed crystal of appropriate size and orientation into the opposite end of the passage so as to make contact with the meniscus of the liquid melt, increasing the pressure within the melt liquid within the passage so as to produce an all convex meniscus, adjusting the thermal conditions within the passage so that an isotherm at which crystallization will occur exists just above the meniscus and pulling the seed crystal in a direction out of the passage so as to pull the melt through the freezing isotherm to produce a crystal.

Typically the initial introduction of the liquid melt into the slot will involve the application of pressure to the melt.

The invention also lies in crystalline material, preferably in the form of a ribbon or strip and preferably a single crystal, when grown in accordance with the foregoing method.

Figure 2:
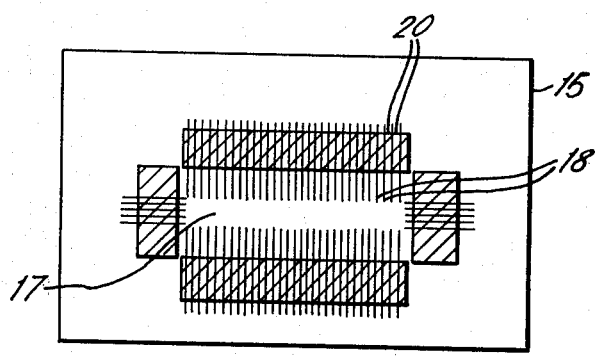

The invention will now be described by way of example with reference to the accompanying drawings, in which:

FIG. 1 is an enlarged cross sectional view through two adjoining ridges supporting a liquid surface in accordance with the invention, and FIG. 2 is a plan view of a die containing a slot through which crystallising material can be pulled, and formed in accordance with the invention.

Figure 2A:
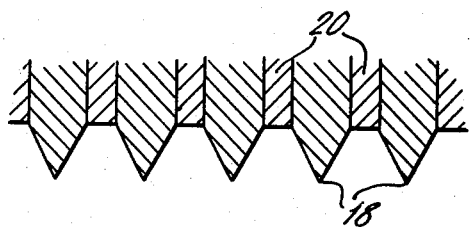

FIG. 2a. is an enlarged view of some of the inwardly directed ridges forming the walls of the slot of FIG. 2.

Figure 3:
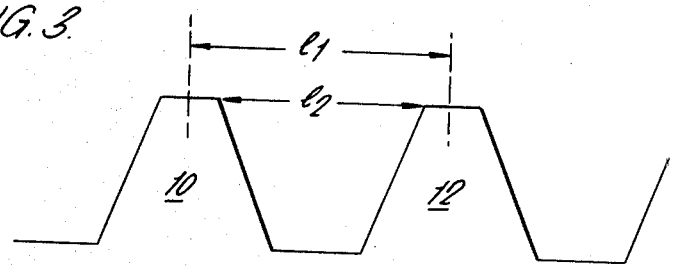
Figure 4:
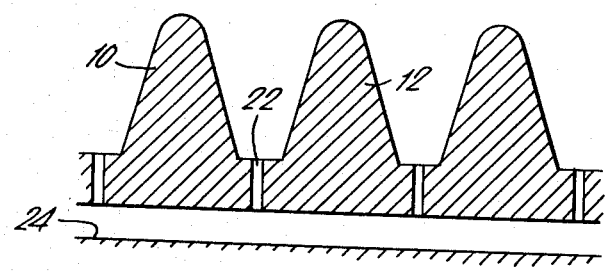
Figure 5:
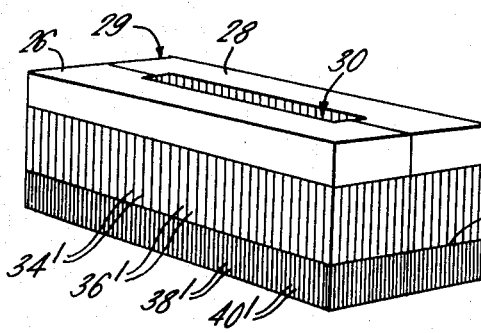
Figure 6:
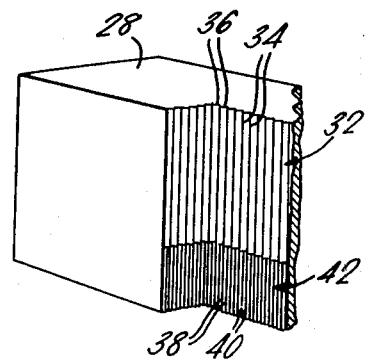
Figure 7:
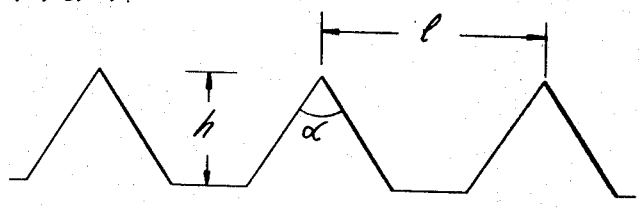

FIG. 3 illustrates the case where the ridges are definitely truncated;

FIG. 4 illustrates a further embodiment in which the liquid surface is further supported by a fluid under pressure, FIG. 5 is a perspective view of a preferred die construction, FIG. 6 is a perspective view to an enlarged scale of part of one of the two halves which together make up the die of FIG. 5, FIG. 7 is a diagrammatic cross section through part of the slot wall surface of a die such as shown in FIGS. 5 and 6 and is used as a model for demonstrating how values for the spacing and depth of the grooves is arrived at, to assist in the machining operation.

Figure 8:
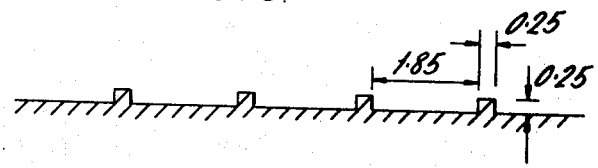

FIG. 8 is a cross section through part of a slot wall surface, machined to produce parallel sided ridges, with actual dimensions shown for Beryllia where the melt is Silicon.

Figure 9:
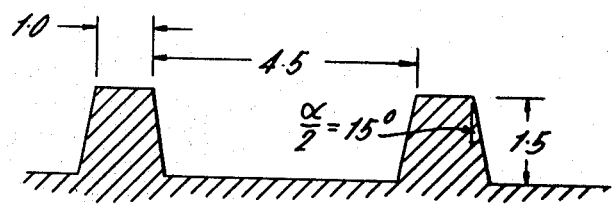
Figure 10:
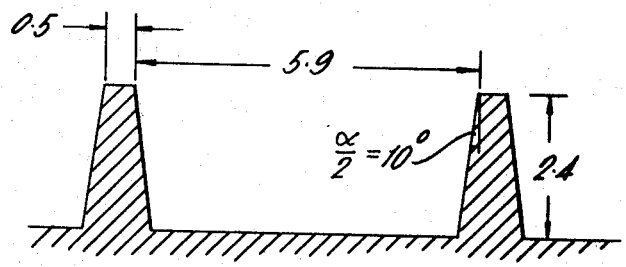

FIG. 9 is a further cross section through part of a slot wall surface, machined to produce ridges of trapezoidalcross section, with actual dimensions shown for Pyrolytic Boron Nitride, where the melt is Silicon, and FIG. 10 is a further cross-section through part of a slot wall surface, machined in a similar manner to that of FIG. 9 with actual dimensions shown for Graphite, where the melt is Germanium.

GENERAL CONSIDERATIONS

A rough surface can be considered to comprise a regular distribution of elemental points or ridges, the distance between any two points or ridges being sufficiently small as to ensure that the surface of the liquid is substantially maintained by means of surface tension forces between adjoining points. To this end a plurality of points may be arranged for instance at the corners and centers of an array of abutting regular hexagons. Alternatively the elemental points may be non-regularly dispersed over the surface (such as will be the case after a sandblasting operation), provided that the spacing between nearest adjoining points is within a range of values such that the points are not too close to present a substantially continuous surface to the liquid nor are they so far apart as to cause the liquid to substantially fill the troughs between the points.

Where the surface is to contain a liquid flow as in the region of a slit through which crystallizing material is to be pulled, the roughening may be in the form of knife edge ridges extending parallel to the direction of flow with adjoining ridges being spaced by a distance sufficiently small that the liquid surface is maintained clear of the main surface (i.e. the bottoms of the troughs or grooves) between adjoining ridges, by means of surface tension. However it is to be understood that the ridges need not be parallel to the direction of flow and perpendicular or "cross-hatch" ridges may be preferable. For example cross-hatching allows an increased peak to peak spacing for a given sag of the liquid compared to parallel continuous ridges, although it is more difficult to machine. Furthermore the surface may be formed by machining or otherwise forming one or more helical ridges or grooves. The points or ridges may be formed by means of removal of the material from or deposition of the material onto, the surface of a solid member, or may represent the inwardly directed points or edges of discrete members which are held apart from adjoining members in a sandwich configuration by an outer support means of suitable form. Where the points/ridges are formed by deposition the material forming them need not be the same as the material on which they are deposited. Thus for example only a small quantity of an expensive suitable material need be employed to form the points or ridges on a cheaper base material which is not so suitable for forming the points or ridges. Likewise a material which is more suitable to the forming of small radius of curvature points and ridges may be deposited on base material which would not allow such sharp points or ridges to be formed.

MODEL SURFACE

For convenience a surface which is roughened by the formation in or on the surface of a plurality of regularly spaced parallel symmetrical ridges will be considered. A similar mathematical analysis can be applied to a surface formed by machining a single or multi start helia, or a surface in or on which a series of cones are formed and regularly arranged so as to provide a plurality of points, or to a surface incorporating ridges or cones which are not regularly spaced or symmetrical.

Based on surface geometry considerations the maximum degree of contact reduction is apparently achieved if the following three conditions are met by the surface roughening.

(1) If the angle subtended by the two sloping sides of each ridge when viewed in cross section is equal to $\alpha$ and the angle of contact measured outside the liquid between the liquid and the material from which the vessel is formed equals $\beta$ when the following relationship must exist in order to ensure that the liquid surface will be wholly supported and will not follow the sloping side of the ridge:

$$\alpha \text{ must be less than } (180-2\beta) \ldots \qquad (1)$$

(2) If the spacing between the peak of adjoining ridges is l, the surface tension of the liquid is s and the hydrostatic pressure within the liquid at the surface to be supported is denoted by p, then if the surface of the liquid is to be supported from the top of the ridges by means of surface tension then the spacing between adjoining ridges must not be greater than:

$$2 \frac{s}{p} \cos(\beta + \frac{\alpha}{2}) \qquad (2)$$

Typically l would be measured in cms, s in dynes/cm and p (which is the amount by which the hydrostatic pressure of the melt differs from the surrounding environment) in dynes/cm$^2$.

If the spacing is greater than this the liquid will penetrate the valleys (troughs) between the ridges to a depth at which the supported span is the same length as it would be if the spacing were in accordance with (2) above. This would increase the area in contact with the peak of each ridge and reduce the ratio of suspended liquid area to area of liquid in contact, therefore reducing the benefits to be gained by the invention.

(3) Where the spacing l between the ridges is critical (i.e. is as large as (2) will allow) for a given liquid having particular values of s and p, the amount h by which the liquid surface will penetrate into the trough between adjoining ridges (i.e. will diverge from a straight line joining the ridges) can be computed from the following formula:

$$h = \frac{s}{p}(1 - \sin(\beta + \frac{\alpha}{2})) \qquad (3)$$

h, s and p would be measured as in formula (2).

Therefore the depth of the trough must be greater than the value of h which can be computed from the formula above for any given liquid. In arriving at values for s, $\beta$ and p for use in equations (2) and (3) above the following points have to be considered.

1. Although there are published figures for the surface tension s of most liquids, it has been found that there can be a considerable variation between one source and another. It will be noted that in both equations (2) and (3) the value of s will have a direct bearing on the computed value of l or h and since too large a value of s will result in too large a value of l being predicted, it is recommended that either a mean value of published values for s is used, or if in doubt, the lowest published value.

The value of s may of course be obtained by experiment using techniques such as are referred to in Chapter 6 of *The General Properties of Materials by Newman and Searle published by Edward Arnold Ltd. London (Fifth Edition)*.

2. The value of $\beta$ for any particular liquid melt - die surface combination may be obtained experimentally by measurements on a single drop of the liquid on a surface of the given die material, as described in the above mentioned reference.

3. The value of p for a given liquid melt can be calculated using the Laplace equations for the derivation of the pressure differential across a curved surface also dealt with in the above mentioned reference. Alternatively it can be calculated using the equations (3) (4) and (5) contained in British Patent Application No. 52379/74 Metals Research Ltd. for defining $Pc_1$ and $Pc_2$, which equations have in fact been derived from the Laplace equations.

The value of p is not calculated as the absolute melt pressure but can more accurately be described as the pressure differential across the supported surface.

In practice a smaller spacing (i.e. smaller value for l) is usually employed than is obtained by substituting the minimum value of p for the liquid melt surface forming the meniscus surrounding the growth interface, since in order to take full advantage of the DSPG process it is important for the growth interface to be able to move up and down in the passage without the support for the liquid melt surface given by the rough surface of the passage, breaking down.

In the same way (and for similar reasons) the troughs below the ridges (or points) are made deeper than the theoretical minimum given by strict application of equation (3) contained herein, and an indication of the safety factors used by the applicants is contained in the consideration of particular examples of die material/liquid melt combinations referred to later.

PRACTICAL CONSIDERATIONS APPERTAINING TO THE PRODUCTION OF ROUGH SURFACES

FIG. 1 shows two ridges 10 and 12 being two of a large number of ridges formed on the surface of a liquid supporting wall 14. The angle between the sides of the two adjoining ridges is denoted by $\alpha$ and on the assumption that the sides of the ridges are not curved the angle subtended between the sides of each ridge at the peak of the ridge, will also be $\alpha$. The ridges are formed for example by machining and may be two of a plurality of parallel ridges or two adjoining ridges in a single or multi-start helix.

Depending on the material from which the ridges are formed (which may be the same as the material from which the wall 14 is formed or may be a different material which is deposited on the wall 14), the radius of curvature at the peak of each ridge and in the valley between each pair of ridges may be large or small. In order to achieve the advantages of the invention, (1) the radius of curvature at least at the peak of each ridge should be as small as is possible having regard to the mechanical properties of the material used and consistant with the wear and tear of handling and maintenance, and (2) the angle between the two inclined sides of the adjoining ridges must be less than $(180-2\beta)$, i.e. formula (a) must be satisfied. The angle subtended between the tangent to the melt surface and the inclined side of a ridge is denoted by $\beta$ in FIG. 1. The angle $\beta$ corresponds to the angle of contact $\alpha$ previously referred to herein and it will be seen that since $\alpha$ is less than $(180-2\beta)$, the surface of the liquid 16 will have no tendency to spread down the side of each ridge, if the spacing between the crests of the two ridges 10 and 12 satisfies formula (2). The reason for this, is that the surface tension force acting in the liquid surface between the adjoining ridges is sufficient to support the liquid surface between the ridges although the liquid may bulge into the trough between the ridges to a greater or lesser extent. Where the spacing between the crests of the ridges is the maximum that the surface tension forces can accommodate for the particular value of pressure p, (3) can be used to compute the amount by which the liquid surface will bulge into the trough away from a straight line drawn between the two crests of adjoining ridges 10 and 12.

So far the effect of the finite radius of curvature of the crests of the peaks has been disregarded. In practice the peaks will not be infinitely sharp but as indicated in FIG. 1 may be rounded and the blunted end will result in an increased area of contact between the liquid and the supporting surface when considered overall. Thus considering a rounded end, if the radius of curvature of the peaks of the ridges is too large the area of liquid surface in contact with the peaks of the ridges will be increased to such an amount that the ratio of free area to area of liquid in contact with a solid material will be reduced to such an extent that much of the advantage of the invention will be lost. Consequently where the radius of curvature of the peaks of the ridges 10 and 12 is large, as may be the case where the material 14 of the vessel wall is unsuitable for the formation of knife like edges, it is all the more important that the spacing l between adjoining ridges is as large as formula (2) will allow for the particular values of surface tension and pressure of the liquid 16. However it must not be so large that the liquid penetrates to the bottom of the grooves to such an extent that the advantage of surface tension support is reduced to an unacceptable extent.

FIG. 2 shows in plan view a die (15) having a passage (17) in the form of a slot through which crystallising material can be pulled and in which the area of the surface of the passage wall surface which actually makes contact with the melt is reduced in accordance with the invention. In this particular example the die is formed from a large number in plates 18 each of which is spaced from its neighbours by a small distance on either side at least in the region of the inwardly directed edges of the plates which co-operate to define the walls of the slot. The spacing material is denoted by reference numeral 20 and may be in the form of discrete wafers which are sandwiched between the plates 18 and the whole assembly one each side of the slot clamped, for example by means of bolts (not shown). Alternatively the material 20 may be cast into position with the plates supported in a parallel array so as to form an integral block.

As shown in enlarged detail in FIG. 2a the inwardly directed edge of each plate 18 taper in thickness to form a symmetrical knife edge.

The angle subtended between the inclined surfaces of each knife edge in FIG. 2a, and between the inclined surfaces of adjoining knife edges, must conform to formula (1) above, having regard to the angle of contact of the particular liquid which is to be used. The lateral spacing between the sharp edges is governed by formula (2) above.

While sharp peaks are the preferred case since they give the largest unsupported liquid area to supported liquid area ratio, it is sometimes not possible to produce such peaks in practice, particularly when machining grooves into a weak material.

In this case it may be convenient to deliberately form a flat top to the peaks, simple to make them easier to form. Thus in FIG. 3 the relevant dimension that must not be exceeded if the liquid is to be just supported above the troughs without running down the sides of the peaks is $l_2$, where $$l_2 = 2\frac{s}{p}\cos(\beta + \frac{\alpha}{2}).$$

The width of the flat peaks, is $l_1 - l_2$ and it would normally be desirable to reduce this to a minimum, the ideal being when $l_1 = l_2$, i.e. sharp peaks.

As shown in FIG. 4 apertures 22 may be formed in the main surface of the die between the ridges 10, 12, which communicate with a manifold 24 into which a fluid (either gas or liquid) can be pumped under pressure to allow the fluid to flow into the grooves to further assist in supporting the liquid surface between the peaks. Alternatively the fluid (i.e. gas) can flow from the grooves to the working environment, in the event that the latter is continuously evacuated during the growing process. FIGS. 5 and 6 illustrate a preferred form of die typically formed from Graphite. It is in two halves 26 and 28 which abut together to form a block (29) having a central slot 30. Although not shown, a clamp is provided for retaining the two halves together or they are bolted or bonded together.

Although not shown, locating pips on one die half and recesses on the other die half may be provided to help locate the two halves when they are first brought into abutting contact.

FIG. 6 shows more clearly how one half of the central slot 30 is formed in each half. As required by the invention the surface of the die half defining the slot walls is machined with parallel grooves which as shown, are parallel to the direction in which a crystal is pulled out of the slot 30 when the two halves are clamped to form the die. The grooves are spaced so as to form closely spaced parallel ridges.

As indicated in the foregoing section entitled "Model Surface", since the slot in the die will be a deep one (i.e. in excess of 1 cm and typically more than 2 cms) the variation in pressure within the melt at different levels in the slot (and where it floats, around the die) must be taken into account. The net effect is that, if the slot is fed from below, the pressure within the liquid at the bottom of the slot will be greater than the pressure halfway up (the normal position of the growth interface) or at the top of the slot.

To reduce the machining requirements it has been proposed herein that two (or more) different ridge spacings may be employed, with in this case the spacing between the ridges near the bottom of the slot smaller than the equivalent spacing between ridges nearer to the upper end of the slot. To this end the die shown in FIGS. 5 and 6 is shown as having two distinct regions in which the surface has been roughened to a different extent in accordance with the invention. There is an upper region 32 in which the spacing between the ridges 34 left by the grooves 36 is greater than the spacing between the ridges 38 left by grooves 40 in the lower region 42 of the slot wall.

Where (in order to reduce cross-contamination) th roughening is continued around the underside of the die and part way up the external surfaces of the die, the same reduced spacing is employed up to the level denoted by the line 44 (see FIG. 5) and to this end the ridges and grooves found in the lower regions of the external surfaces of the die 29 are denoted by reference numbers 38' and 40' respectively whilst those in the upper regions of the external surfaces, (where the spacing can be increased to that employed in the upper region 32 of the slot), are denoted by the reference numerals 34' and 36' respectively.

Although not shown the underside of the block 29 may be machined with two sets of grooves. The first set running from side to side and intersected by a second set of grooves running from end to end, so that there is registration between the grooves in the side faces and the underside, along all four edges of the block.

Although graphite can be machined, sharper ridges (i.e. smaller peak angles) between the grooves can be obtained by coating the surfaces of the die halves with for example Pyrolytic Boron Nitride, and machining the coating to produce the parallel grooves 32.

SPECIFIC EXAMPLES OF DIE/MELT COMBINATIONS.

Before giving the specific examples, reference is made to FIG. 7 which illustrates an idealised groove/ridge form, which can be closely approached in practice using appropriate machining techniques and appropriate materials.

If the angle of contact between melt liquid and the material from which the die ridges are formed, is $\beta$ and the peak angle of the ridges is $\alpha$ the following conditions have to be met (from above) viz:

$$l < 2\frac{s}{p} \cdot \cos(\beta + \frac{\alpha}{2}) \text{ and}$$

$$h > \frac{s}{p} \cdot \left[1 - \sin(\beta + \frac{\alpha}{2})\right].$$

where
s is surface tension in dynes/cm
p is hydrostatic melt pressure in dynes/cm$^2$ and
l and h are denoted in FIG. 7.

It is also noted that the values of l and h will depend on the hydrostatic pressure of the melt which in turn is governed to a large extent by the slot width. In the examples given below, a slot having a width of 0.002" (i.e. 0.5 mm and a considerably greater length dimension is assumed, and the hydrostatic pressure in the melt needed to force the particular liquid into such a slot is the value which will be used when applying the formulae above.

Lastly a safety factor is, in practice, incorporated and having calculated values for l and h from the formulae above, actual values for l and h (i.e. L and H) are calculated from $L = \frac{3}{2}l$ and $H = 2h$.

EXAMPLE I

Silicon with Beryllia die material.

For this system $\beta$ is 80° hence $\alpha$ (the angle subtended by the two sides of each ridge) must be less than 20°.

By machining sharp edges or points, $\alpha$ can be reduced to 0° giving:

$l < 2.78 \times 10^{-3}$ inches (i.e. approx. 0.07 mm), and $h > 0.12 \times 10^{-3}$ inches (i.e. approx. 0.003 mm)

hence final values for the surface are, (for $\alpha = 0$):

$L = 1.85 \times 10^{-3}$ inches (i.e. approx 0.046 mm)

$H = 0.25 \times 10^{-3}$ inches (i.e. approx 0.006 mm)

Referring to FIG. 8, which is a section of a surface produced by parallel passes of a diamond slitting wheel, it will be seen how $\alpha$ can be made 0°. In practice the width of the rectangular ridges (shown as $0.25 \times 10^{-3}$ inches (i.e. approx 0.006 mm)) is made as small as possible.

EXAMPLE II

Silicon with Pyrolytic Boron Nitride die material.

For the system $\beta$ is 50° hence $\alpha$ must be less than 80°. Let $\alpha$ be 30° (rather than 0°) because of the difficulty of machining sharp edges/corners, giving:

$l < 6.76 \times 10^{-3}$ inches (i.e. approx 0.17 mm), and $h < 0.75 \times 10^{-3}$ inches (i.e. approx 0.019 mm)

hence the final values for the surface are (for $\alpha = 30°$):

$L = 4.5 \times 10^{-3}$ inches (i.e. approx. 0.112 mm)

$H = 1.5 \times 10^{-3}$ inches (i.e. approx. 0.375 mm)

FIG. 9 shows the profile of a ridged surface machined to these requirements. The surface may be produced by milling Pyrolytic Boron Nitride.

Alternatively, the surface would be approximated by sandblasting.

EXAMPLE III

Germanium with Graphite die material.

For this system $\beta$ is 50°. hence $\alpha$ must be less than 80°.

Let $\alpha$ be 20° (rather than 0°) because of the difficulty of machining Graphite to give a sharp edges/corners, giving:

$l < 8.9 \times 10^{-3}$ inches $h > 1.19 \times 10^{-3}$ inches hence the final values for the surface are (for $\alpha = 20°$)

$L = 5.9 \times 10^{-3}$ inches (0.149 mm)

$H = 2.4 \times 10^{-3}$ inches (0.061 mm)

FIG. 10 shows the profile of a ridged surface machined to these requirements.

The surface may be produced by direct milling of a graphite block or could be approximated by sandblasting.

We claim:

1. A shape forming member having a passage for defining the meniscus of a melt which is to be crystallized and through which the crystallized material is drawn and in which at least the surface of the passage is formed from a material having an angle of contact $\theta$ with the liquid melt of less than 90°, ($\theta$ measured outside the liquid): wherein at least the passage is formed with a rough surface (as herein defined) so as to reduce the angle of contact $\theta$.

2. A shape forming member as set forth in claim 1 wherein the passage is a narrow slot so as to permit the growth of crystals in the form of a strip or ribbon.

3. A shape forming member as set forth in claim 1 wherein at least a part of the external surface thereof is formed with a rough surface (as herein defined).

4. A shape forming member as set forth in claim 1 wherein the material forming at least the surface of the passage is selected from the group Silicon Carbide, Pyrolytic Boron Nitride, Silicon Nitride, Quartz, Beryllia, Thoria and Graphite.

5. A shape forming member as set forth in claim 1 wherein the area of cross-section of the passage increases in the direction of the end thereof from which the crystallized material is drawn.

6. A shape forming member as set forth in claim 1 wherein the surface of at least the passage is formed from a layer of material which is different from the material forming the remainder of the shape forming member.

7. A shape forming member as set forth in claim 1 wherein the said layer is Pyrolytic Boron Nitride and the said remainder is formed from Graphite.

8. A shape forming member as set forth in claim 1 which is made up of separate parts each of which is formed with a recess which co-operates with the recesses in the other parts so as to define the said passage.

9. A shape forming member as set forth in claim 1 wherein the rough surface is comprised of a plurality of closely spaced craters.

10. A shape forming member as set forth in claim 1 wherein the rough surface of the passage comprises a plurality of parallel closely spaced grooves.

11. A shape forming member as set forth in claim 10 wherein the area of cross-section of the passage increases in the direction of the end thereof from which the crystallized material is drawn.

12. A shape forming member as set forth in claim 10 wherein the surface of at least the passage is formed from a layer of material which is different from the material forming the remainder of the shape forming member.

13. A shape forming member as set forth in claim 10 wherein the said layer is Pyrolytic Boron Nitride and the said remainder is formed from Graphite.

14. A shape forming member as set forth in claim 10 which is made up of separate parts each of which is formed with a recess which co-operates with the recesses in the other parts so as to define the said passage.

15. A shape forming member as set forth in claim 10 wherein the spacing between neighbouring grooves in one region is different from the spacing between neighbouring grooves in a second region.

16. A shape forming member as set forth in claim 1 wherein at least the passage is formed with a plurality of closely spaced protrusions.

17. A shape forming member as set forth in claim 16 wherein the protrusions comprise parallel ridges separated by grooves in the said surface of the passage.

18. A shape forming member as set forth in claim 15 wherein the surface of at least the passage is formed from a layer of material which is different from the material forming the remainder of the shape forming member or die.

19. A shape forming member as set forth in claim 16 wherein the spacing between the neighbouring protrusions in one region in the passage is different from the spacing between neighbouring protrusions in a second region in the passage.

20. A shape forming member as set forth in claim 16 wherein the protrusions comprise parallel ridges and the spacing between neighbouring ridges in one region is greater than the spacing between neighbouring ridges in a second region.

21. A shape forming member as set forth in claim 1 wherein the rough surface is formed by a helical groove in the form of a screw thread form.

22. A shape forming member as set forth in claim 21 wherein the axis of the helix is parallel to the direction in which crystallized material is to be drawn.

23. A shape forming member or die as set forth in claim 21 wherein the axis of the helix subtends an angle greater than 0° but less than 90° to the direction in which crystallized material is to be drawn.

24. A shape forming member as set forth in claim 1 wherein the rough surface is formed by a plurality of helical grooves in the form of a multi-start screw thread.

25. A shape forming member as set forth in claim 1 wherein the rough surface is a fine mesh foil.

26. A shape forming member as set forth in claim 1 wherein the rough surface is a criss-cross lattice.

27. A shape forming member as set forth in claim 1 wherein the rough surface is formed by a helical ridge in the form of a screw thread form.

28. A shape forming member as set forth in claim 1 wherein the rough surface is formed by a plurality of helical ridges in the form of a multi-start screw thread.

29. A shape forming member having a passageway for defining the meniscus of a melt which is to be crystallized and through which the crystallized material is drawn and in which at least the surface of the passage is formed from a material having an angle of contact with the liquid melt of less than 90° C. when measured outside of the liquid melt, wherein at least said passageway is formed with a surface roughened to an extent sufficient to compensate at least in part for an inappropriate relationship between the run-off angle and the contact angle.

* * * * *